United States Patent
Yap et al.

(10) Patent No.: US 8,946,839 B1
(45) Date of Patent: Feb. 3, 2015

(54) REDUCED VOLUME INFRARED DETECTOR

(75) Inventors: Daniel Yap, Newbury Park, CA (US);
Rajesh D. Rajavel, Oak Park, CA (US);
Sarabjit Mehta, Calabasas, CA (US);
James H. Schaffner, Chatsworth, CA (US)

(73) Assignee: HRL Laboratories, LLC, Malibu, CA (US)

( * ) Notice: Subject to any disclaimer, the term of this patent is extended or adjusted under 35 U.S.C. 154(b) by 680 days.

(21) Appl. No.: 12/544,221

(22) Filed: Aug. 20, 2009

(51) Int. Cl.
*H01L 31/0232* (2014.01)

(52) U.S. Cl.
USPC ............ 257/431; 257/E31.002; 257/E31.038; 257/E31.039; 257/E31.093; 257/443; 257/448; 257/449

(58) Field of Classification Search
USPC .......... 136/256; 257/431, 443, 448, 449, 436, 257/E31.002, E31.038, E31.039, E31.093
See application file for complete search history.

(56) References Cited

U.S. PATENT DOCUMENTS

| | | | |
|---|---|---|---|
| 4,183,035 A | 1/1980 | Wang et al. | |
| 4,496,788 A | 1/1985 | Hamakawa et al. | |
| 4,675,525 A | 6/1987 | Amingual et al. | |
| 5,080,725 A | 1/1992 | Green et al. | |
| 5,239,179 A | 8/1993 | Baker | |
| 5,581,084 A | 12/1996 | Chapman et al. | |
| 5,721,429 A | 2/1998 | Radford et al. | |
| 5,963,790 A | 10/1999 | Matsuno et al. | |
| 6,294,723 B2 | 9/2001 | Uematsu et al. | |
| 6,545,289 B1 | 4/2003 | Gunapala et al. | |
| 6,852,920 B2 | 2/2005 | Sager et al. | |
| 6,858,462 B2 | 2/2005 | Zaidi et al. | |
| 7,545,051 B2 | 6/2009 | Yang et al. | |
| 2002/0135869 A1 | 9/2002 | Banish et al. | |
| 2004/0045932 A1 | 3/2004 | Kochergin et al. | |
| 2005/0109388 A1 | 5/2005 | Murakami et al. | |
| 2006/0251995 A1 | 11/2006 | Wille et al. | |
| 2008/0072958 A1* | 3/2008 | Dutta ........................ | 136/256 |

FOREIGN PATENT DOCUMENTS

JP        05259427 A      10/1993

OTHER PUBLICATIONS

Zhao,, et al. "A 19.8% efficiency honeycomb multicrystalline silicon solar cell with . . . ," IEEE Transactions on Electron Devices, vol. 46, No. 10, pp. 1978-1983 (1999).
Kayes, B. M., et al., "Comparison of the device physics principles of planar and radial p-n junction nanorod . . . " J. Appl. Physics, vol. 97, pp. 114302 (2005).
Hu, L.,, et al., "Analysis of Optical Absorption in Silicon Nanorwire Arrays for Photovoltaic Applications," Nano Letters, vol. 7, No. 11, p. 3249 (2007).
Klipstein, P., "XBn barrier photodetector for high sensitivity and high operating temperature infrared . . . ," Proceedings of SPIE, vol. 6940, paper 69402U-1 (2008).

(Continued)

*Primary Examiner* — Michael Shingleton
(74) *Attorney, Agent, or Firm* — Janus Law Group

(57) ABSTRACT

An absorber is disclosed. The disclosed absorber contains a base layer, and a plurality of pillars disposed above the base layer and composed of material configured to absorb an incident light and generate minority electrical carriers and majority electrical carrier, wherein the height of the pillars is predetermined to provide a common pyramidal outline shared by the pillars in the plurality of pillars.

31 Claims, 18 Drawing Sheets

(56) References Cited

OTHER PUBLICATIONS

Tokranova, N., et al.,"Hybrid Solar Cells Based on Organic Materials Embedded Into Porous Silicon," Proc. SPIE, 5724, 183-190 (2005).
Technical Information document (SD-12), Characteristics and use of infrared detectors, by Hamamatsu Photonics K. K, pp. 1-43 (2004).
A. Rogalski (Journal of Applied Physics, vol. 93, No. 8, 15, pp. 4355-4391 (2003).
Green, M.A., et al. , "Very High Efficiency Silicon Solar Cells—Science and Technology," IEEE Transactions on Electron Devices, vol. 46, No. 10, pp. 1940-1947 (1999).
Campbell, P., et al., "Light Trapping Properties of Pyramidally Textured Surfaces," J. Appl. Phys., vol. 62.1, American Institute of Physics, pp. 243-249 (1987).
Brendel, R., et al.,"Ultrathin crystalline silicon solar cells on glass substrates," Applied Physics Letters, vol. 70, No. 3, pp. 390-392 (1997).
Swanson, R. M., et al. "Point-contact silicon solar cells," IEEE Transactions on Electron Devices, vol. ED-31, No. 5, pp. 661-664 (1984).
Sinton, R.A., et al., "27.5 percent silicon concentrator solar cells," IEEE Electron Device Letters, vol. EDL-7 No. 10, pp. 567-569 (1986).
Yuan, H.,et al., "FPA Development: from InGaAs, InSb to HgCdTe," Proceedings of SPIE vol. 6940, paper 69403C, (2008).
Ashley, T., et al., "Epitaxial InSb for elevated temperature operation of large IR focal plane arrays," Proceedings of SPIE vol. 5074, pp. 95-102 2003).

\* cited by examiner

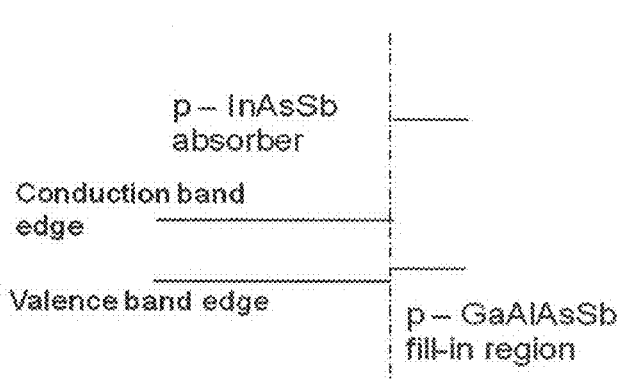 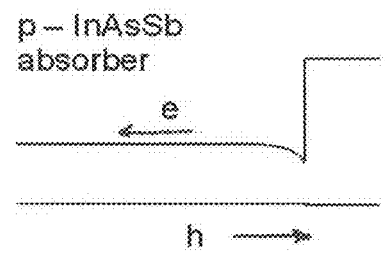
Fig. 11a
Fig. 11b

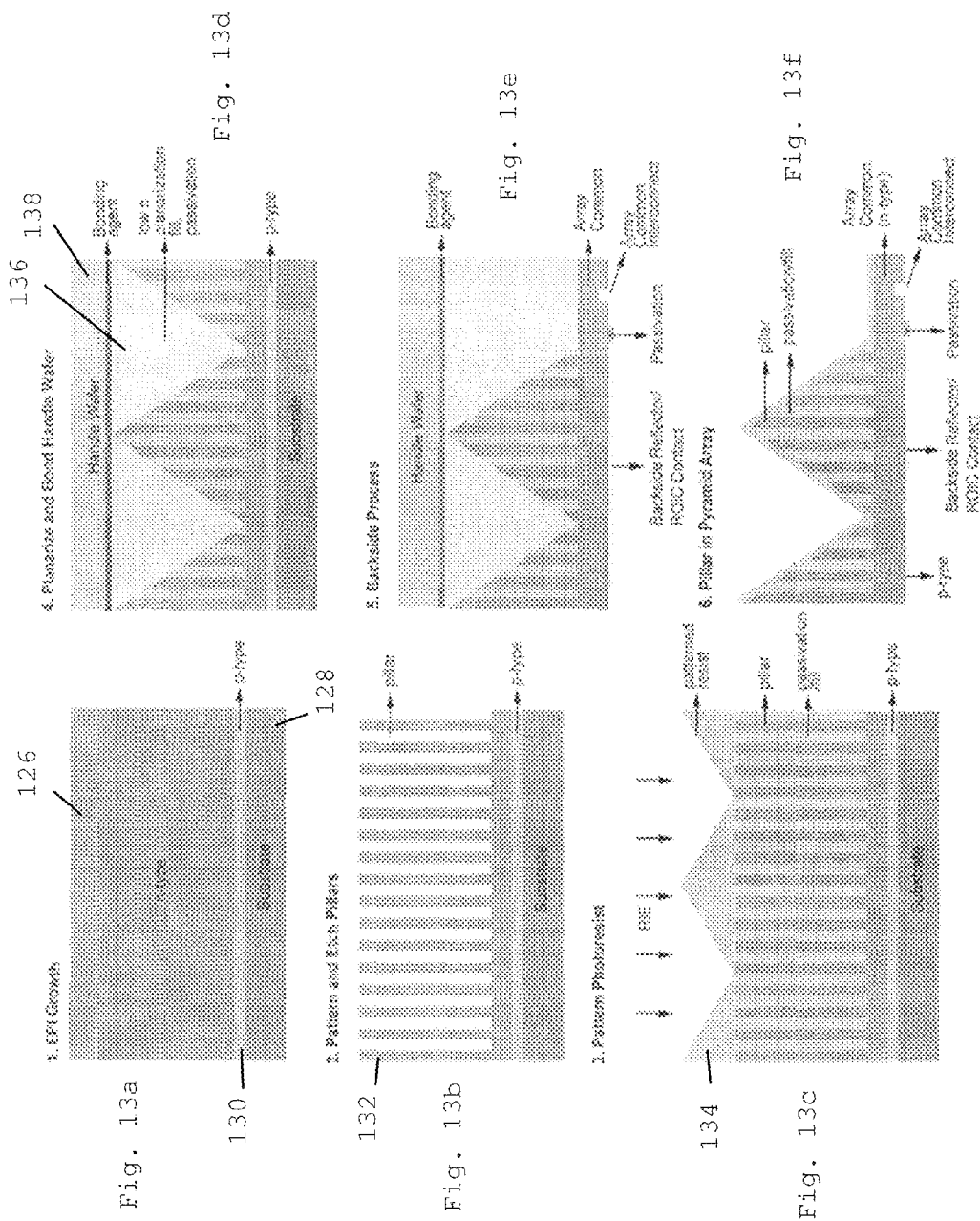

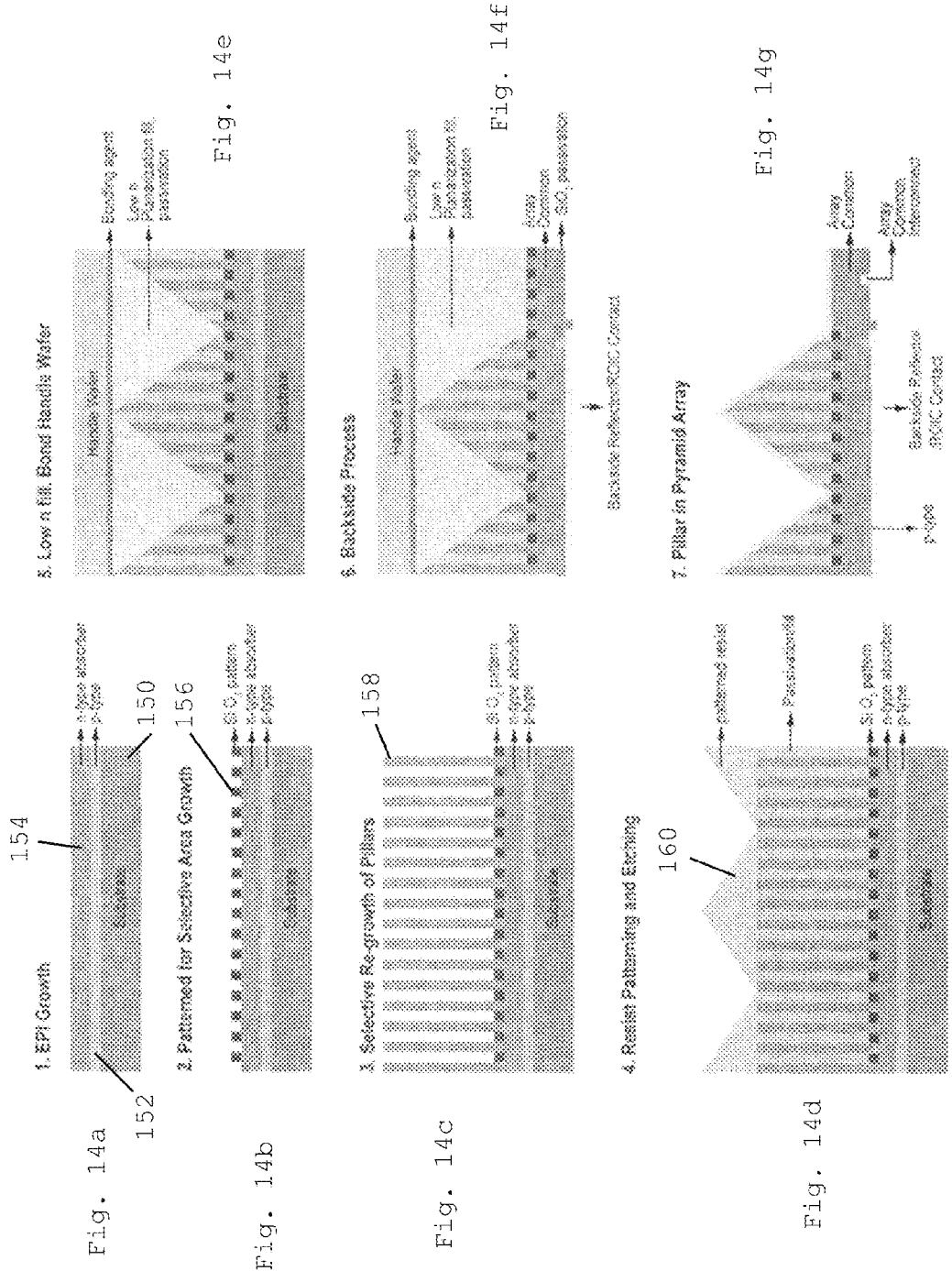

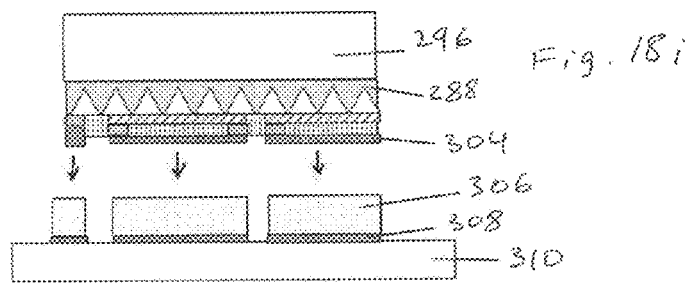
Fig. 18i
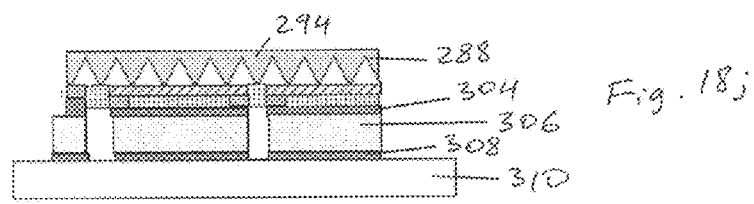
Fig. 18j
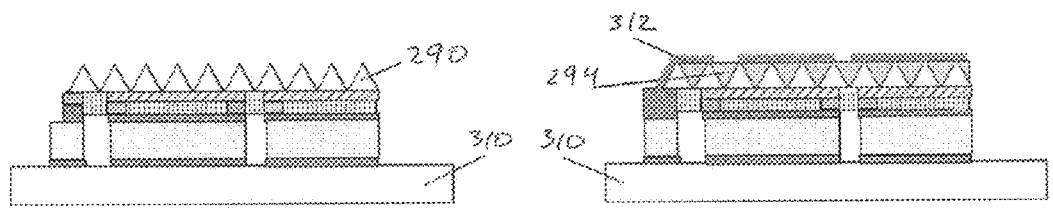
Fig. 18k
Fig. 18l

REDUCED VOLUME INFRARED DETECTOR

This application is related to co-pending application U.S. application Ser. No. 12/544,218, filed on the same date as the present application, for "Wide Bandwidth Infrared Detector and Imager" by Daniel Yap, Rajesh D. Rajavel, Sarabjit Mehta and Joseph S. Colburn, the disclosure of which is incorporated herein by reference in its entirety. This application is also related to co-pending application U.S. application Ser. No. 12/544,213, filed on the same date as the present application, for "Honeycomb Infrared Detector" by Daniel Yap and James H. Schaffner, the disclosure of which is incorporated herein by reference in its entirety.

FIELD

The present disclosure relates generally to photon detectors. More particularly, the present disclosure relates to an absorber material used with the photon detectors.

BACKGROUND AND PRIOR ART

According to prior art, optical quantum detectors (which absorb incident photons and generate electrical charge carriers) generally have highest sensitivity over a fairly small bandwidth, generally one octave or less. Contrary to the present disclosure, prior art detectors, used in optical imagers, generally make use of an optical anti-reflective coating to increase the amount of incident light that is coupled into their light-absorbing material.

Prior art infrared detectors are described in a Technical Information document (SD-12) by Hamamatsu Photonics K. K. Examples of prior photovoltaic and photoconducting detectors that have sensitivity in MWIR and/or LWIR wavelengths are described in an article by A. Rogalski (Journal of Applied Physics, vol. 93, no. 8, 15 Apr. 2003, pp. 4355-4391). In general, these detectors are formed as 2-dimensional arrays of detector pixels that are connected physically and electrically to a silicon read-out integrated circuit (ROIC). Photovoltaic detectors typically contain P-type semiconductor material, N-type semiconductor material and a PN junction. The incident light can be absorbed primarily in the P-type material, primarily in the N-type material or in substantially both P-type and N-type materials.

As depicted in FIGS. 1a-1d, prior infrared detectors 20, 22 and 24 often comprise a substrate 10 on which the array of detector pixels 12 is formed. The incident light 14 illuminates the substrate 10 and passes through the optically transparent substrate 10 to the detector pixels 12, as depicted in FIG. 1a. For these detectors, each detector pixel 12 may be connected to the ROIC 18 by means of a solder bump 16, depicted in FIG. 1b. With the detectors 20 and 22, the substrate 10 is generally not removed and individual pixels 12 are defined by etching mesa structures that include the PN junction of a detector pixel 12. For detector 24, illustrated in FIG. 1c, which comprise a thick film of the light-absorbing material 30, electrical vias 28 are etched through the absorbing film 30 and a PN junction 32 is formed around each of the vias 28. Metal 34 is then coated over the vias 28 and provide electrical connections between the PN junctions 32 and the ROIC 18. According to prior art, detectors 20, 22 and 24 can be coated with an anti-reflecting film to improve the capture of the light 14. The anti-reflecting film is normally composed of one or more quarter-wave thickness layers of material that have a value for its refractive index that is between the value of the refractive index of the incident medium (such as air) and the refractive index of the substrate 14.

According to prior art, the infrared detectors 20, 22 and 24 can achieve high external quantum efficiency only over a limited optical bandwidth because of their anti-reflective coatings. Because a quarter-wave thickness is achieved exactly for only one specific wavelength of the incident light, the anti-reflective coating is effective for only a small band of wavelengths (nominally less than an octave).

To achieve high internal quantum efficiency, the light-absorbing layer (or layers) of infrared detectors in the prior art must have a thickness that is sufficiently large to permit enough of the incident light, coupled in through its front surface, to be absorbed. In fact, the thickness of the absorber must be sufficient to absorb light at the longest wavelength of its desired band of operation. For high efficiency, that thickness is typically several times the value of the longest wavelength of the band, even when the detector has a metal reflector at its back side that enables the overall path-length of the light through the absorber to be doubled. Noisy "dark" current can be generated in the volume of the absorber because of thermal generation of electrical carriers. Thus, having a thick absorber means that the total volume of material contributing to the dark current is large, and the dark current is high. This degrades the detectivity of the detectors 20, 22 and 24. In contrast, a novel infrared detector (imager) presently disclosed, does not require an anti-reflecting film and it provides low reflection for incident light over a large bandwidth of multiple octaves with reduced dark current.

Like optical quantum detectors, solar cells have also been developed to absorb light, however at visible wavelengths. And, solar cells generally do not absorb light at MWIR wavelengths. Solar cells are generally made from material such as silicon. Although both solar cells and infrared imagers have been widely used commercial products for several decades, there does not appear to be any known attempts to combine the features of these two kinds of devices.

Surfaces with shallow pyramid-shaped features and the light trapping benefits of such surfaces are known from the field of solar cells. An article by M. A. Green, et al. ("Very High Efficiency Silicon Solar Cells—Science and Technology", IEEE Transactions on Electron Devices, vol. 46, no. 13, October 1999, pp. 1940-1947) describes solar cells that contain pyramid-shaped surfaces. The light trapping properties of pyramidally textured surfaces is described in an article by P. Campbell and M. A. Green (Journal of Applied Physics, vol. 62, no. 1, 1 Jul. 1987, pp. 243-249). Prior art solar cell 38, depicted in FIG. 2, has pyramids 40 with height that are small compared to the overall thickness of the light-absorbing material 42. This is because for solar cells, the dark current noise is not a problem of concern. In contrast, in the infrared imager presently disclosed, the height of the pyramid is large compared to the overall thickness of the light absorbing material, with that pyramid height being about one half of the overall thickness of the light absorbing material.

Another prior art solar cell 44, depicted in FIG. 3, has pyramids 46 whose height is large compared to the overall thickness of the light absorbing material 48. This solar cell is described in an article by R. Brendel, et al. ("Ultrathin crystalline silicon solar cells on glass substrates," Applied Physics Letters, vol. 70, no. 3, 20 Jan. 1997, pp. 390-392). In the solar cell 44, the PN junctions 50 are located near the sloped faces or sidewalls at the backside of the device. In contrast, for some embodiments of the present invention, the PN junctions may be located near the tips of the pyramid structures at the backside of the device. This allows the infrared imager presently disclosed to achieve reduced area of the junction depletion regions, thereby reducing the dark current from those depletion regions.

Another prior art solar cell with back-side electrical contacts whose PN junction area is small is described in an article by R. M. Swanson, et al. ("Point-contact silicon solar cells," IEEE Transactions on Electron Devices, vol. ED-31, no. 5, May 1984, pp. 661-664). Solar cells having localized PN junctions at their back side as wells as pyramid-shaped texturing of their front side are depicted in FIG. 4 and are described in an article by R. A. Sinton, et al. (27.5 percent silicon concentrator solar cells," IEEE Electron Device Letters, vol. EDL-7 no. 10, October 1986, pp. 567-569). Diffusion of the doped regions to create such PN junctions involves subjecting the material to fairly high temperatures, generally >400 degrees-C., and is not compatible with the processes involved in fabricating devices that have thin light absorbing material.

An article by Kayes, et al. (J. Appl. Physics, vol. 97, pp. 114302 (2005)) describes another solar cell with regions of light absorbing material comprising high-aspect-ratio nanorods 52 as shown in FIG. 5. Each nanorod has a radial PN junction. An article by Hu, et al. (Nano Letters, vol. 7, no. 11, p. 3249 (2007) reports simulation results for the reflectance and absorption of a nanorod array structure. The PN junctions in these prior art light absorbers and electrical current generators are very different from the PN junctions of the presently disclosed detectors. These prior art devices have very large PN junction area and thus the relative contribution of the dark current due to generation in the junction depletion regions is very high. In contrast, the presently disclosed detectors have smaller PN junction area and they can benefit from the reduction of the absorber volume.

A novel infrared detector (imager) with low reflection for incident light over a large bandwidth of multiple octaves and with reduced dark current is presently disclosed.

BRIEF DESCRIPTION OF THE FIGURES

FIG. 11a depicts electronic energy band alignment in detector with high-index semiconductor fill-in with "flat band" condition according to the present disclosure.

FIG. 11b depicts electronic energy band alignment in detector with high-index semiconductor fill-in with band bending when absorber and fill-in are at the same Fermi level according to the present disclosure.

FIGS. 13a-13f depicts fabrication process involving etched pillars according to the present disclosure.

FIGS. 14a-14g depicts fabrication process involving selective area growth of pillars according to the present disclosure.

FIG. 15b depicts calculations for absorption vs. wavelength for the detector in FIG. 15a.

FIGS. 18a-18l depict a fabrication process for manufacturing optical imager.

Figure 1:
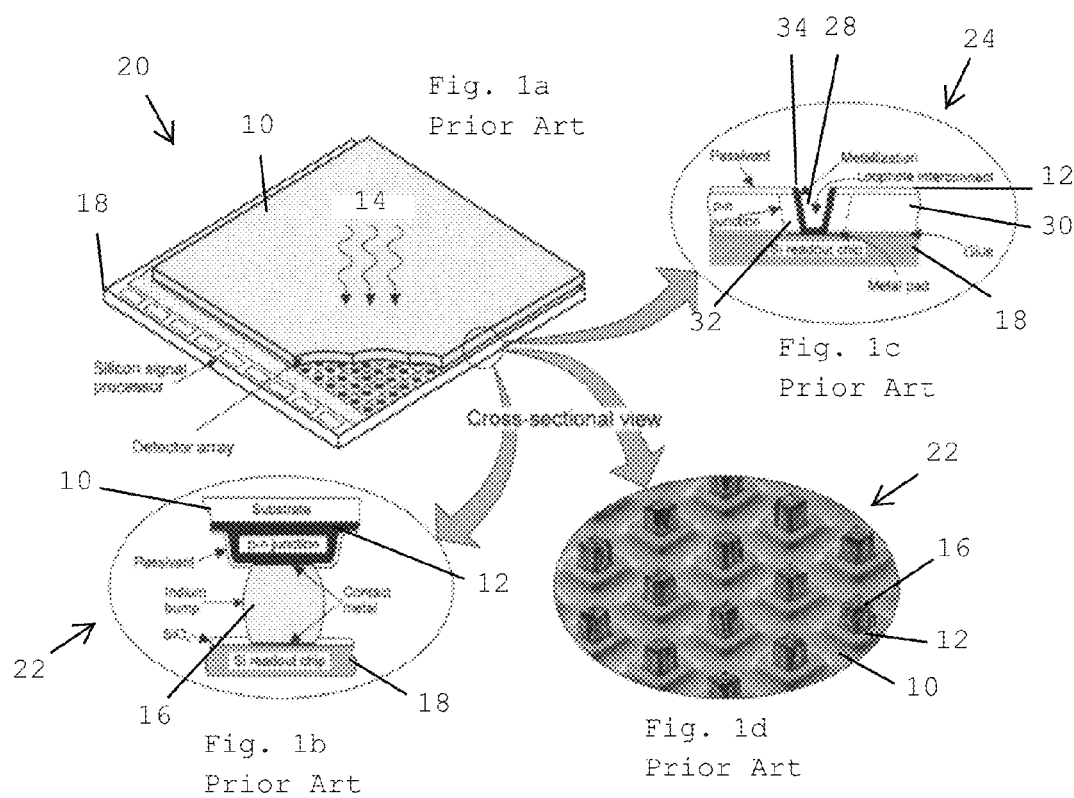
FIGS. 1a-1d depict Prior-Art optical imagers.
Figure 2:
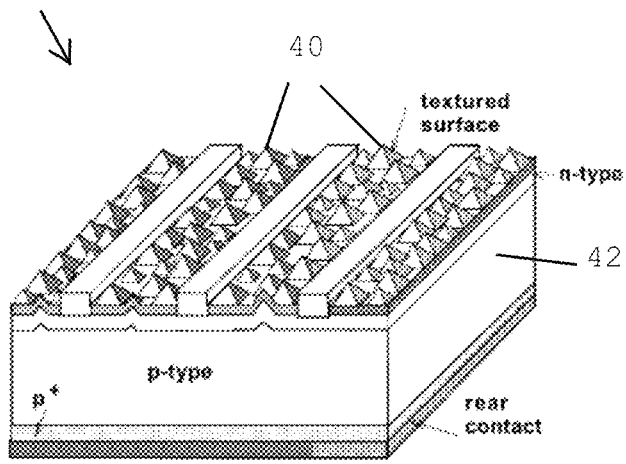
FIG. 2 depicts Prior-Art solar cell with pyramidally textured surface.
Figure 3:
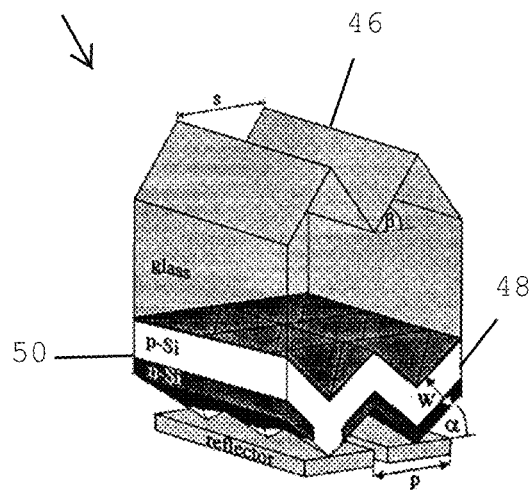
FIG. 3 depicts Prior-Art solar cell with sloped sidewalls.
Figure 4:
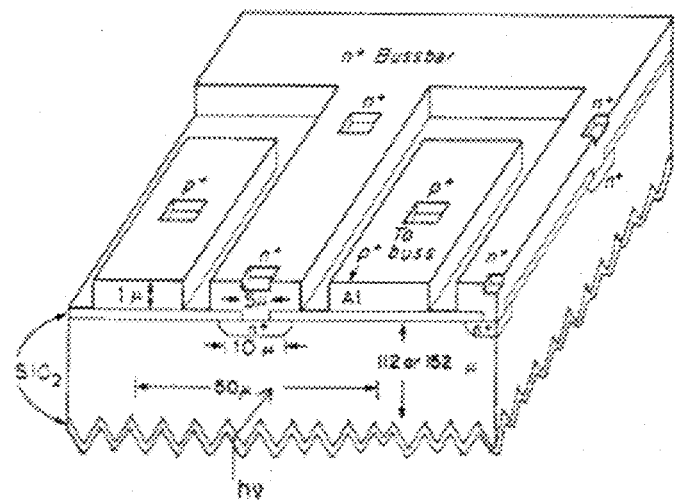
FIG. 4 depicts Prior-Art solar cell with back side contacts.
Figure 5:
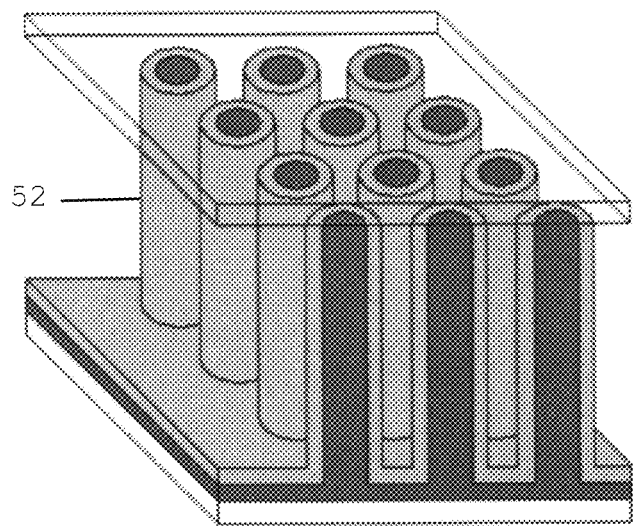
FIG. 5 depicts Prior-Art solar cell with nanorods with PN junction.

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

DETAILED DESCRIPTION

The present disclosure relates to photon detectors that may be used in a focal-plane-array optical imagers. The constraints for photon detectors are quite different from the constraints associated with most solar cells described above. The photon detector performance is given in terms of its signal to noise ratio. Although the detected signal is to be maximized, the noise (from thermal generation of electrical carriers rather than from carrier generation accompanying photon absorption) must be kept low. In contrast, a solar cell is concerned with carrier generation but not with noise. Furthermore, the photon detector usually has an absorber material with a direct energy-band gap. Thus, the absorption efficiency is high. Usually the thickness of the absorber is no more than 2 times the longest wavelength of the light to be absorbed, especially when there is a back-side reflector for two-pass absorption. In contrast, most solar cells have an absorber material such as silicon with poor absorption efficiency. Thus, the thickness of a solar cell typically is many times larger (e.g., 10 times to 50 times larger) than the wavelength of the light to be absorbed.

The novel infrared detector (imager) presently disclosed contains novel quantum detectors having very broad bandwidth, for example, such as having sensitive detection ranging from visible to midwave infrared (MWIR) wavelengths (e.g., 0.4-5.0 µm). The imager may contain an array of multiple detectors, arranged as a collection of pixels, that are electrically coupled to a read-out integrated circuit. Also, the pixel array may lie on a focal plane of imaging optical elements, such as lenses.

The detector presently disclosed may contain an array of light detecting regions further comprising an ensemble of light absorbing pillars of varying height. The outline of these pillars may form a set of pyramids. The pillars can have rod-like shapes, cone-like shapes or other shapes of tall aspect ratio. The pillars may be covered by a layer of surface-passivating material. The detector may also contain a base layer located beneath the pillar. This base layer may be continuous in the lateral direction (in the plane of the substrate). The base layer may absorb the incident light but also could be transparent to that light. The detector may also contain one or more extractor regions for extracting the photo-generated minority carriers from the absorber and, in combination with ohmic contacts coupled to the extractors, producing an electrical current output of the detector. The extractor regions may be located toward the back side of the detector. The detector may also contain at least one ohmic contact located on its back side that serves to extract the photo-generated majority carriers.

In one exemplary embodiment, the pillars may be surrounded by a fill material that has a low refractive index and is transparent to the incident light. In another exemplary embodiment, each semiconductor pillar may be surrounded by a semiconductor material, having similarly high refractive index as the pillars, that may not absorb the light. The high-index semiconductor material has a wider bandgap than the bandgap of the absorber material. Also, the conduction and valence band edges of the high-index fill material and of the absorber material may be aligned such that photo-generated majority carriers are conducted through the heterojunction between those materials. Thus, there is a continuous path for the lateral flow of the majority carriers through a pyramid and from one pyramid to another in the detector according to the present disclosure.

In one exemplary embodiment, the electrical common contacts may be used to groups detectors in to an array rather of detector. Thus, the photo-generated majority carriers can flow laterally among multiple detectors in the array.

Presently disclosed quantum detector may be used in a broadband imager, having sensitivity over near infrared (NIR) to midwave-infrared (MWIR) wavelengths, or even extending to longwave-infrared (LWIR) wavelengths. This detector has high detectivity, D*, because it has lower dark current but still high quantum efficiency even though its bandwidth is so broad. The lower dark current is achieved by reducing the volume of its light absorbing material, compared to detectors with planar absorber regions. For the narrow bandgap absorbers of MWIR detectors, the main contribution to the dark current at temperatures of 200K and higher is due to thermal generation in the absorber. Thus, the dark current can be reduced by reducing the volume of that absorber material.

According to the present disclosure, pillared absorber with low-index filler has low reflectance of the incident light, because of the low net refractive index of that structure. By properly selecting the width and spacing of the pillars, the absorption can be kept relatively high and the front-side reflectance low. This keeps the quantum efficiency of the detector high. The pillared absorber with high-index filler resembles a solid pyramidal absorber, which also has low front-side reflectance. An advantage of this pillared absorber with high-index filler over the solid pyramidal absorber is that the volume of its absorber material is smaller, so its dark current can be even lower. In the pillared absorber with low-index filler, the lateral conduction of the photo-generated carriers is provided by the base layer and, in some embodiments, by the extractor. In the pillared absorber with the high-index, wide-bandgap filler, the lateral conduction of the majority carriers can be provided by the filler while the lateral conduction of minority carriers is provided by the base layer and the extractor. Thus, by using the wide-bandgap filler, the thickness of the base layer can be made much smaller compared to the thickness required for the low-index filler.

The purpose of the imager presently disclosed is to achieve high-sensitivity detection of the incident light over a much broader band of optical wavelengths than is obtained with previously known optical imagers. The disclosed optical detectors are designed to have high sensitivity over many octaves of optical bandwidth, with that detection bandwidth possibly being greater than one decade. The high sensitivity may be achieved by reducing the reflection of the incident light by the detector for all of those wavelengths of the incident light. Also, the high sensitivity may be achieved by efficiently capturing and absorbing the incident light (photons) to produce electrical carriers (electrons and holes), with the amount of output electrical current extracted from the detector being related to the amount of light incident upon the detector pixel. And, the high sensitivity may be achieved by minimizing the dark current, by reducing the volume of light-absorbing material, which introduces noise from its thermal (dark) generation of electrical carriers.

Figure 6:
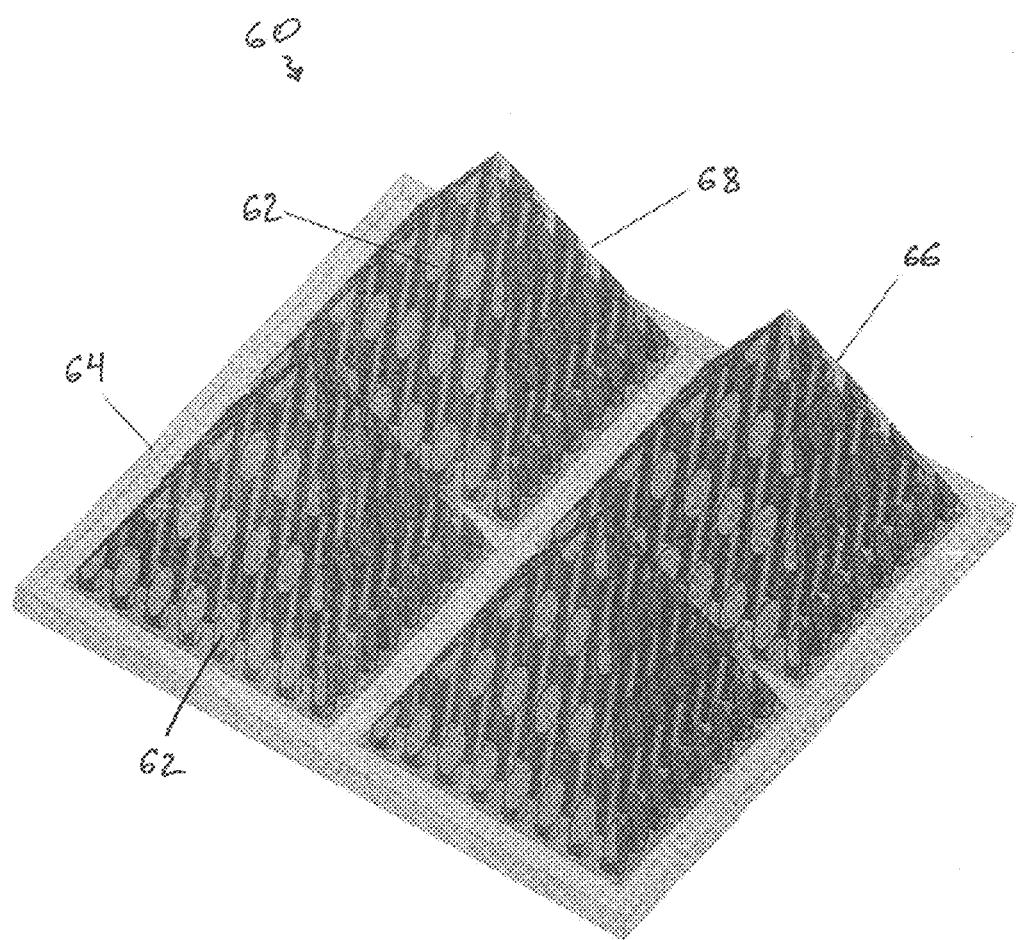
FIG. 6 depicts an exemplary embodiment of a detector pixel according to the present disclosure.

FIG. 6 depicts a detector pixel 60 of an infrared detector array that comprises ensembles of pillar-shaped absorbers 62 of the incident light (not shown). The heights of the pillars 62 in each ensemble may be adjusted to match a pyramidal outline 68. The pyramids formed by the pillars 62 can have small gaps between the bases of adjacent pyramids (as illustrated in the FIG. 6) or they can have their bases touching (not shown). The pillars 62 are located directly above, and may be in contact with, a base layer 64. The base layer 64 may contain additional absorber material similar to the material of the pillars 62. Even when adjacent pyramids do not abut, the base layer 64 may provide electrical interconnection between adjacent detectors of the array. The base layer 64 material may be of the same dopant type (n-type or p-type) as the absorber material. The pillars 62 may have rod-like shapes, cone-like shapes or other high-aspect-ratio shapes.

The detector pixel 60 may also contain fill-in material 66 that covers the sidewalls of the pillars 62. The fill-in material 66 that surrounds a pillar 62 may be in contact with at least a portion of the fill-in material 66 that surrounds an adjacent pillar 62. However, the fill-in materials 66 do not necessarily need to completely fill the space between the pillars 62. The combination of the fill-in regions 66 and the absorber pillars 62 has a pyramidal shape 68, as shown in FIG. 6. The fill-in material 66 may also serve to passivate the sidewalls of the pillars 62, controlling the electronic surface states at the sidewalls of the pillars 62. Also, the top side of the pyramids 68, and the base layer 64 may be covered with a surface-passivation layer (not shown) that does not absorb the incident light of interest if the pyramids 68 do not abut each other. In an exemplary embodiment, the passivation material may be composed of silicon dioxide, polymers such as benzo-cyclo-butene, ammonium sulfide further covered by a material such as silicon dioxide, and a wide-bandgap semiconductor such as GaAlAsSb. If the fill-in layer 66 does not act as a suitable surface passivant, the sidewalls of the pillars 62 may further be covered with a suitable surface passivant, such as the materials listed above, which is sandwiched between the absorber pillar 62 and the fill-in material 66.

The absorber pillars 62 absorb the incident light to be detected by the detector array. This detected incident light can comprise a wide range of wavelengths, such as ranging from near infrared (NIR) wavelengths greater than 0.7 micrometers to midwave infrared (MWIR) wavelengths as great as 5.0 micrometers. The detected incident light also could comprise other ranges of wavelengths, such as visible wavelengths of far infrared (FIR) wavelengths. The detector array may also have additional portions that act to extract or collect the photo-generated electronic carriers (the electrons and holes) and generated an electrical current, the output signal, from each detector pixel of the array.

Figure 7:
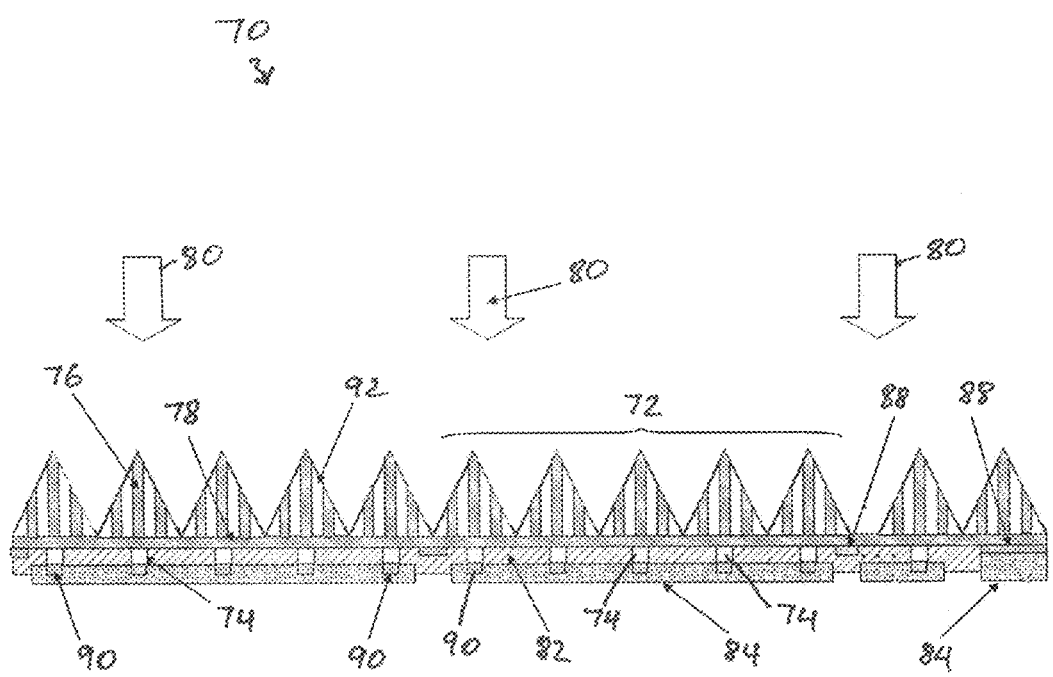
FIG. 7 depicts an exemplary embodiment of a photodetector array according to the present disclosure.

FIG. 7 depicts a novel detector array 70 according to the present disclosure. Each detector pixel 72 contains extractor regions 74 that serve to extract or collect the minority carriers from the absorber pillars 76. The extractor regions 74 lie on the back side of the base layer 78, the side away from the incident light 80. The extractor regions 74 of the detector array 70 may have an area that is smaller than the area of the base layer 78. In an exemplary embodiment, the ratio of total area of the extractor regions 74 in a detector pixel 72 to the area of the base layer 78 may be as small as 1:10 or 1:100. The portions of the back side of the base layer 78 that are not covered by the extractor regions 74 may be covered by a surface passivant 82 and then a metallic reflector/metal bond pad 84 of the incident light 80 to be detected. This allows the detector array 70 to have a mirror located at its back side that facilitates multiple passes of the light through the pyramids and the base layer 78. Thus, the overall height of the pyramids and base layer 78 may be reduced and yet provide high absorption of the incident light 80. The top surface of the detector array 70 may also contain a passivation material 92 that is optically transparent at the wavelengths of interest.

The detector array 70 may also contain metal-to-semiconductor contacts 88 and 90. In one exemplary embodiment, the contacts 88 and 90 are Ohmic contacts. The contacts 90 may be formed at the back side of the extractor regions 74. The contacts 90 of a detector pixel 72 may be electrically interconnected by a metal bond pad 84 that covers most of the back side surface of the detector array 70. The metal bond pad 84 may be used to bond the pixel to a read-out integrated circuit (not shown) when the detector array 70 is part of a focal-plane array imager (not shown). The detected signal current from a detector pixel 72 is, thereby, obtained through the metal bond pad 84. The contacts 88 serve to extract the majority carrier photo-current from the detector array 70 and can be a common collector of current for a group of multiple detector pixels 72 or possibly even for the entire detector array 70. Thus, the current for each pixel is obtained through the contacts 74 of that pixel 72 and the common current for the detector array 70 is obtained through the contacts 88. The contacts 88 may be located beneath some of the valleys between pyramids. The area of the contacts 88 associated with a pixel 72 or group of pixels may be much smaller than the area of the base layer 78 associated with the same pixel 72 or group of pixels.

The absorber pillars 62, 76 can be arranged with a pillar located directly at the tip of a pyramid, as illustrated in FIG. 7 or the absorber pillars 62, 76 can be arranged such that a space between pillars is located where the tip of a pyramid would be, as illustrated in FIG. 6. The space may be filled with a fill-in material 66, 92. The dimensions of the pyramids may be constrained by the wavelengths of the incident radiation to be detected by the detector. In general, the width of the pyramids is approximately equal to or is greater than the wavelength L2 of the longest-wavelength (lowest frequency) radiation to be detected. In general, the width of a pillar is greater than one-half the wavelength L1 of the shortest-wavelength (highest frequency) radiation to be detected. In general, the spacing between pillars is smaller than the wavelength L1 of the shortest-wavelength radiation to be detected. The height of the tallest pillar depends on the desired absorption efficiency of the detector and on whether there is an optical reflector at the back side of the detector. In general, the height of the tallest pillar is on the order of the wavelength L2 of the longest-wavelength radiation to be detected. Although the preceding discussion provides general guidelines for selecting the dimensions of the pillars, the spacing between pillars and the size and spacing of the pyramids, the detectors also can have other arrangements and dimensions for the pillars and pyramids therein.

Figure 8:
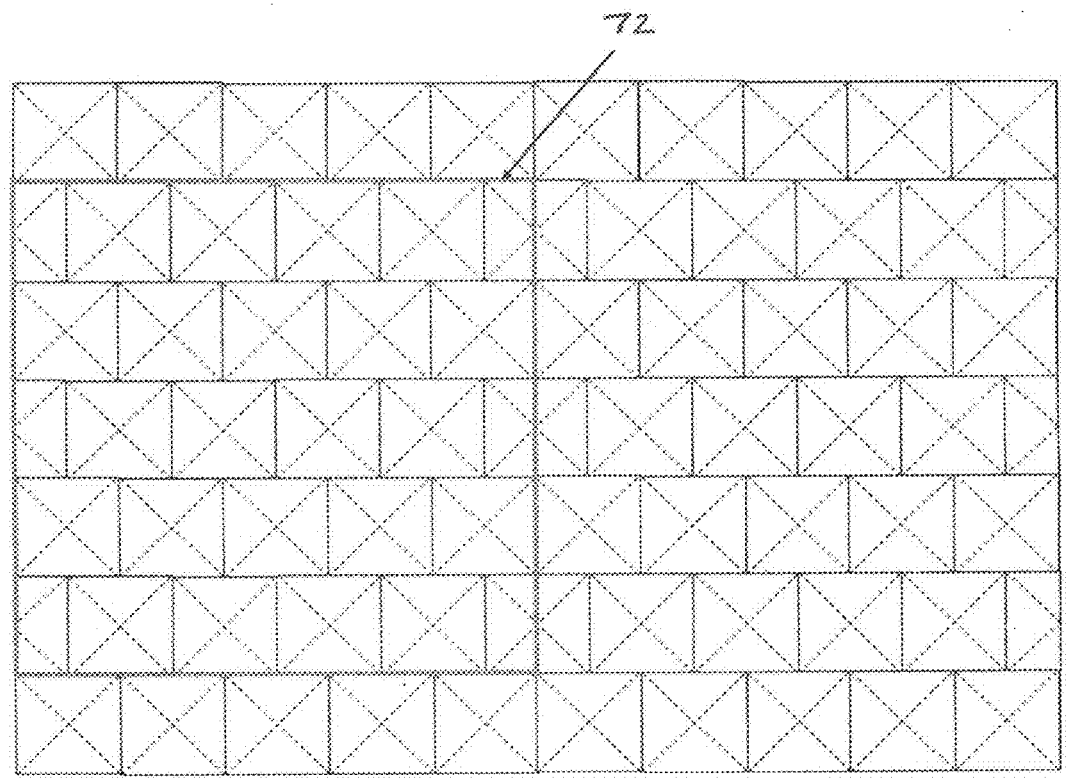
FIG. 8 depicts a top view of the photodetector array shown in FIG. 7.
Figure 9:
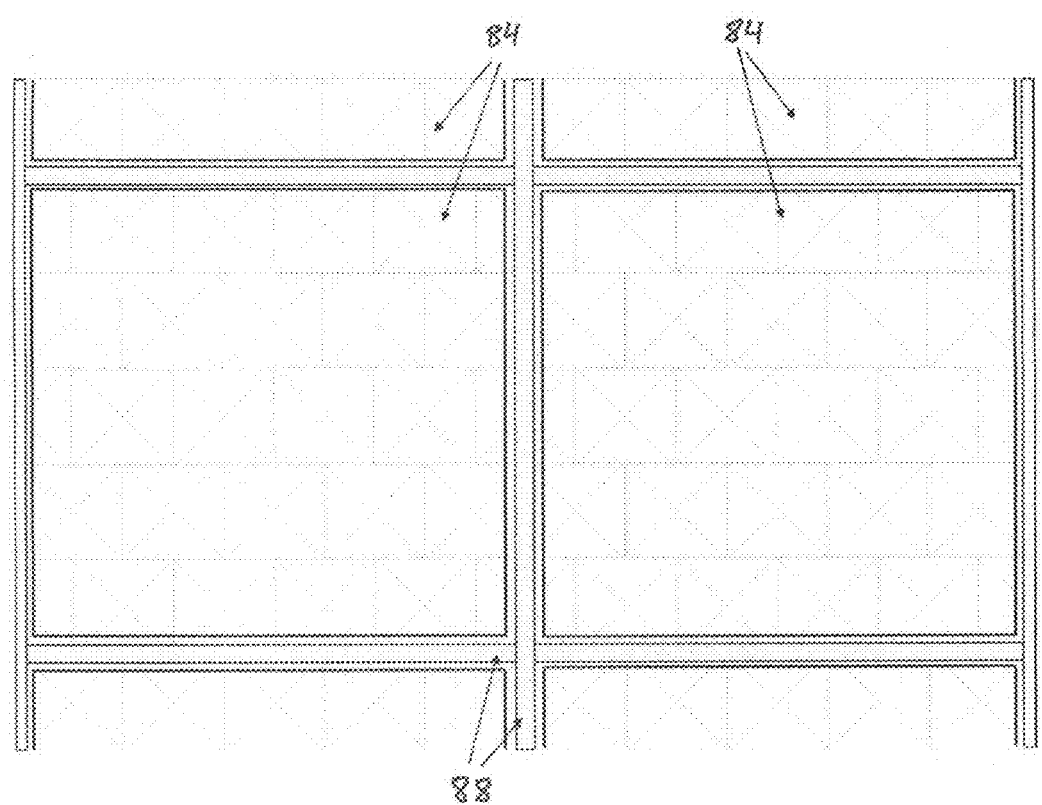
FIG. 9 depicts a bottom view of the photodetector array shown in FIG. 7.

The contacts 88 may comprise small-area regions that are electrically interconnected by metal lines, as shown in FIGS. 8 and 9. These metal lines are preferably located near the periphery of a detector pixel. The metal interconnect lines connect the contacts 88 to one or more bond pads 84 for the electrical common, with those common bond pads 84 preferably located near the periphery of the array. FIG. 8 depicts a top-side view of the detector array 70, whereas FIG. 9 depicts a bottom-side view of the detector array 70. When viewed from the top side (FIG. 8), the detector array 70 looks like a collection of multiple pyramids with each pyramid further containing many pillars. None of the contacts or the metal interconnects are visible from the top side in this embodiment. Thus, there is no obstruction to the incident light 80 that could potentially prevent the incident light 80 from being absorbed by the absorber pillars 76. Also, since the top-side surface passivation material 92 is optically transparent at the wavelengths of interest, there is minimal attenuation of that incident light 80 before that light reaches the absorber pillars 76.

Figure 10A:
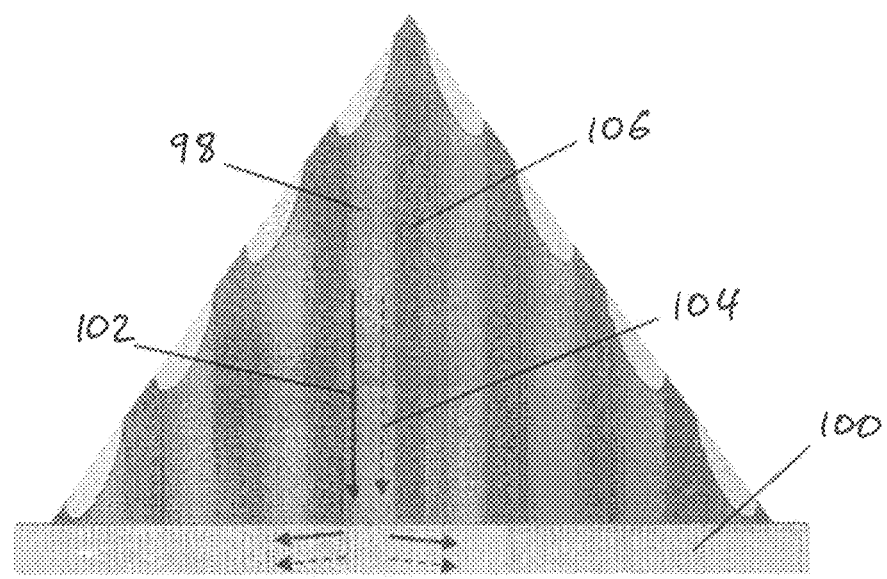
FIG. 10a depicts flow of electrical carriers with low-index dielectric fill-in according to the present disclosure.

The fill-in regions between the absorber pillars 76 may contain a material 92 with low refractive index or air (unfilled). Alternatively, the fill-in regions may contain material 92 with high refractive index, with an index value close to that of the absorber pillars 76. Referring to FIG. 10a, the low-index material 106 is a dielectric that does not conduct electrical current. Thus the photo-generated minority carriers 102 and majority carriers 104 flow vertically through a pillar 98 downward to the base layer 100. The carriers 102 and 104 may then flow laterally in the base layer 100 to the various extractor regions (not shown), through which the photo-generated minority carriers 102 are collected. The need to provide sufficiently low resistance paths for the electrical current constrains the diameter of the pillars 98 and the thickness of the base layer 100 to be sufficiently large. In an exemplary embodiment, a pillar diameter of 1 micrometer with a maximum pillar height of 5 micrometers may be sufficient. Also, a base-layer thickness of 0.5 micrometers for a pixel size of 20 micrometers may also be sufficient.

Figure 10B:
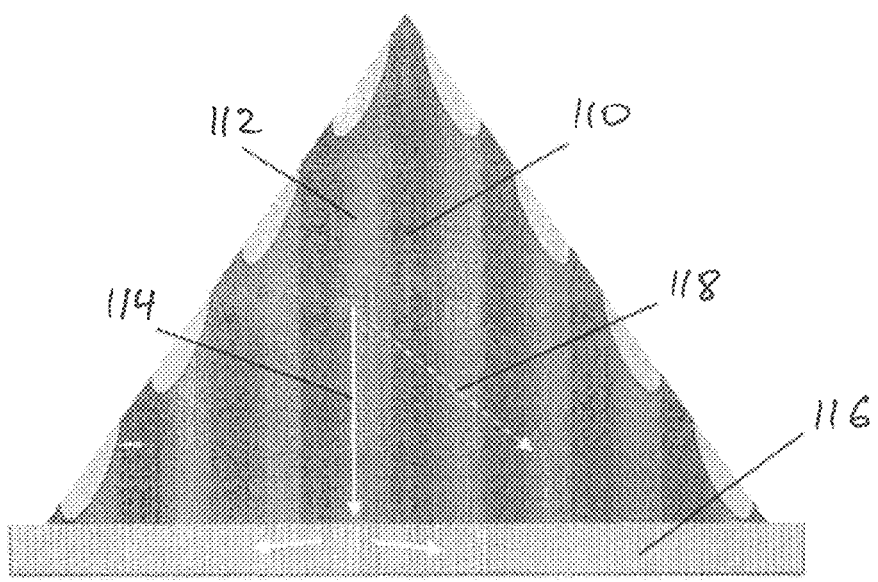
FIG. 10b depicts flow of electrical carriers with high-index dielectric fill-in according to the present disclosure.

FIG. 10b depicts an alternative construction of a pillared pyramid. In this exemplary embodiment, the fill-in regions between the pillars 112 contain a semiconductor material 110 that is transparent to the incident light to be detected. This fill-in material 110 has a large band gap so that light is not absorbed by the typical inter-band processes. As shown in the FIG. 10b, the photo-generated minority carriers 114 flow downward through the pillars 112 to the base layer 116. Those minority carriers 114 can then flow laterally in the base layer 116 to the extractor regions (not shown). The photo-generated majority carriers 118, are able to flow laterally through the pillars and through the fill-in regions 110. The fill-in regions 110 need not completely fill all of the space between the pillars 112 but at least should form a physically contiguous path for the flow of the majority carriers 118. By providing this lateral majority-carrier 118 flow in the pyramidal structure, the thickness of the base layer 116 can be made much thinner since those majority carriers 118 do not flow entirely in the base layer 116 to their contacts (not shown).

The semiconductor material of the pillars 112, 98, the fill-in 110 and the base 100, 116 should efficiently conduct or transport the photo-generated majority and minority carriers without having those carriers recombine while in those regions. For example, consider the illustration in FIG. 10b of the photo-generated minority carriers 114 flowing through pillars 112 and base 116 to the extractor regions (not shown) that are located on the back side of the base 116. A metric that can be used to describe this efficiency of carrier transport is the diffusion length, which depends on the carrier mobility and carrier lifetime. In general it is desirable to have the diffusion length for the minority carrier be substantially greater than the height of the pillars, the thickness of the base layer and the width of the pyramid. High-quality crystalline materials of semiconductors such as InAs, InAsSb and GaAlAsSb can have minority-carrier diffusion length greater than micrometers or even tens of micrometers. The light-absorbing pillars 112, 98 may comprise lightly doped material so that the minority-carrier lifetime in such material may be longer, to increase the minority-carrier diffusion length. A doping level such as $10^{15}$ cm$^{-3}$ to $10^{17}$ cm$^{-3}$ generally may be suitable. The electrical transport by the majority carriers in a region generally is quite effective because of the much higher carrier concentration of those majority carriers.

The electronic energy-band structures of the high-index fill-in material and the absorber material preferably have a staggered alignment such as the ones depicted in FIG. 11a. In one exemplary embodiment, the absorber may be p-type and comprise InAsSb material that is lattice matched to GaSb material. The fill-in may be also p-type and comprise GaAlAsSb material that is lattice matched to GaSb material. These materials form a Type II energy band alignment, as illustrated in the FIG. 11a. When those two materials are in contact with each other, the energy band in at least one of those materials will bend near their interface. FIG. 11b depicts an exemplary design in which the band bending occurs primarily in the absorber material and there is slight accumulation rather than depletion of carriers at the interface. This suppresses the contribution to the dark current by generation-recombination processes that could otherwise occur in a junction depletion region. Since the overall area of the interface between the absorber pillars and the fill-in regions is so large, this aspect of the dark current could be significant, if not suppressed.

Figure 12:
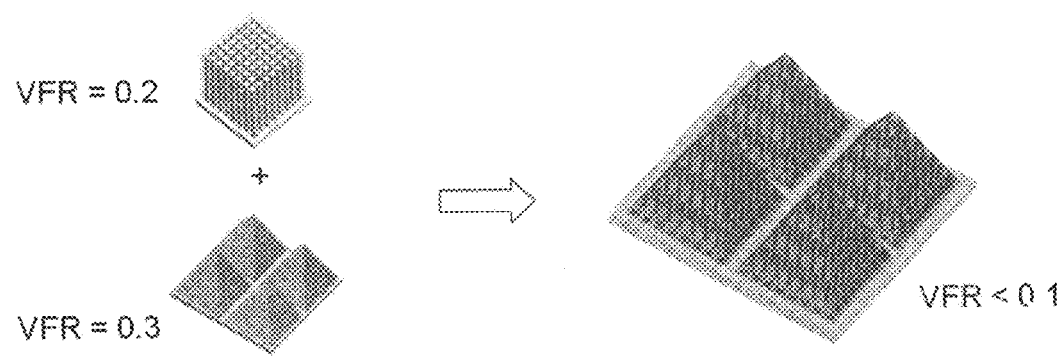
FIG. 12 depicts an outline of detector fabrication approach involving definition of pillars and fill-in followed by definition of pyramidal outline.

The fabrication of the detector array 70 involves first the formation of an ensemble of pillars and then the filling in of the regions between those pillars. Then, the pyramidal outline is etched into the structure, as illustrated in FIG. 12. The ensemble of pillars can have a reduced volume of absorber material, with the volume-fill-ratio (VFR) of the pillar ensemble in general being 0.5 to 0.2. The VFR is the relative amount of the equivalent planar structure that is occupied by absorber material. The VFR of a pyramidal structure is generally 0.25-0.4, depending on the thickness of the base layer. A pyramidal structure with pyramids whose bases abut and which does not have an additional base layer has a VFR of 0.33. By imposing a pyramidal outline onto the ensemble of pillars, the VFR can be further reduced to being less than 0.2 or even less than 0.1. At temperatures of 200K and above, the main contribution to the dark current, which determines the signal-to-noise behavior of an infrared detector, is the thermally generated carriers from the absorber material. Thus, the dark current can be reduced by reducing the volume of the absorber. Since the dark current is due mainly to thermal generation (or SRH generation) in the narrow-bandgap absorber material, reduction of the absorber volume can serve to reduce the dark current and, thereby, improve the detectivity, D*, of the infrared detector.

FIGS. 13a-13f depicts an exemplary fabrication process for constructing the detector array 70 according to the present disclosure. FIG. 13a depicts epitaxial growth of the extractor material 130 and the absorber material 126. In one exemplary embodiment, the extractor material 130 may be a p-type material such as InAlSb material that is grown on InSb substrate wafer 128 or GaSb material or InAsSb material grown on GaSb substrate wafer 128. The absorber material 126 may be an n-type material such as InAlSb material grown on InSb substrate wafer or InAsSb grown on GaSb substrate wafer. An optional stop-etch layer (not shown) may be grown between the extractor 130 and the substrate 128. In an exemplary embodiment, the stop etch material may be InAsSb, for GaSb substrates. Further, an optional separate base layer (not shown) may also be grown between the layers of absorber 126 and the extractor 130 materials. After growing these planar layers, the pillars 132 may be patterned, by such an exemplary means as photolithography, and the pillars may also be etched, by such exemplary means as reactive ion etching, into the absorber layer 126, as shown in FIG. 13b. If there is a separately grown base layer, the pillar etching stops when that base layer is reached. If there is no separately grown base layer, the pillar etching is stopped before the extractor layer 130 is reached so as to leave a portion of the grown absorber material 126 to act as a base layer. The regions between the pillars 132 are then filled in with the fill-in material 134, as shown in FIG. 13c. The deposition of the fill-in material 134 can be done by means such as sputter deposition processes, spinning on and then hardening of viscous liquids, or growth by methods such as metal organic chemical vapor deposition. The fill-in material 134 may then be planarized to be approximately level with the tops of the pillars. Referring to FIG. 13d, the pyramids are etched into the top side of the wafer, etching through portions of the absorber pillars 132 and the fill-in material 134 using methods described below with reference to FIGS. 18a-18l.

In one exemplary embodiment, a surface-passivation film may be deposited onto the sidewalls of the pillars (not shown) before they are covered by the fill-in. In another exemplary embodiment, a surface-passivation film 136 may be deposited onto the sloped sidewalls of the etched and filled-in pyramidal structures as shown in FIG. 13d. This passivation film 136 passivates the surface states of the exposed absorber pillars 132. After the surface passivation 136 is deposited, a layer of removable planarization material (not shown) such as a spin-on glass or polymer may be deposited over the pyramids and then it may be planarized. The top side of the wafer may then be attached to a handle wafer 138 using known methods. The handle wafer 138 serves as a temporary surrogate substrate for the detector array since the substrate 128 on which the epitaxial layers were grown is removed next by a combination of lapping and/or polishing plus etching process, as shown in FIG. 13e. After the original substrate 128 is removed, the backside of the detector is exposed for the backside processing. The backside processing may include patterning and etching the extractor regions, patterning and depositing the ohmic contacts to the extractor and the absorber (not shown). The backside processing may also include depositing and patterning the dielectric surface-passivation film and depositing and patterning the bond pads and the metal interconnect lines (not shown). The detector array, with backside bond pads exposed, is now ready for bonding to the read-out electronic circuit (not shown). After that bonding is completed, the handle wafer 138 may be removed. In one exemplary embodiment, the planarization material 136 covering the pyramids may also be removed. The results is a thin detector array structure whose back side is bonded to the read-out circuit and whose front side is exposed, available for capturing and detecting the incident light. This process is further described below with reference to FIGS. 18a-18l.

FIGS. 14a-14g depict another exemplary process for fabricating the detector arrays 70 according to the present disclosure. Referring to FIG. 14a, a layer of extractor material 154 and the base layer 152 are grown epitaxially onto the substrate wafer 150. A film of a growth-masking material 156 such as silicon dioxide may then be deposited and patterned, as shown in FIG. 14b. Using a process such as, for example, selective-area growth by metal-organic chemical vapor deposition, additional epitaxial material can be grown in the areas where the growth-mask has been removed but there is not material grown over the areas where the growth-mask is present. If the growth mask has a set of holes, the selective-area growth produces a set of pillars 158 aligned over those holes, as shown in FIG. 14c. By adjusting the pressure of the growth chamber and the partial pressures, flow rates and compositions of the reactants for the growth, tall pillars with high aspect ratio may be formed. After the pillars 158 are formed, the sides, and also the tops, of the pillars may be covered with another material 160, as shown in FIG. 14d. By using a different set of deposition conditions such as pressures and flow rates, the covering and fill-in material 160 can be made to grow laterally, over the regions covered by the growth-mask 156. The sides of the pillars 158 serve as the seed regions for this lateral overgrowth. The covering material may have a larger bandgap than the absorber. Also, the covering material may have an energy band alignment that facilitates the flow of the majority carriers, as discussed above. The laterally overgrown material surrounding each pillar 158 may touch and merge with the laterally overgrown material 160 of at least one adjacent pillar. In this way, a continuous path is provided for flow of carriers.

The remaining steps for the fabrication process are similar to the steps discussed above in relation to FIGS. 13d-13f. In an exemplary embodiment, if the handle wafer and the planarization layer above the pyramids both are transparent to the light to be detected, the detector array may be tested while it still is mounted onto the handle wafer. The light can be shone onto and through the handle wafer and the bond pads on the back side of the array are available for probing of the output currents.

Figure 15A:
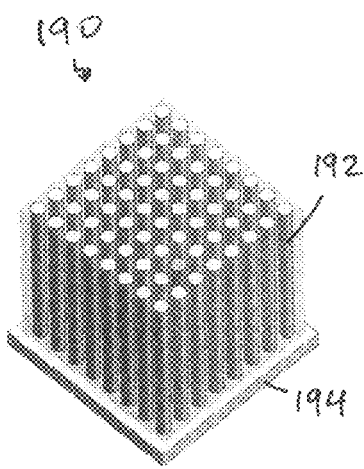
FIG. 15a depicts a detector with rod-shaped absorber pillars according to the present disclosure.

Instead of shaping the heights of the pillars according to a pyramidal outline as discussed above, it may also be possible to just use an ensemble of pillars that have substantially the same height. In an exemplary embodiment, an ensemble of rod-shaped pillars 190 is illustrated in FIG. 15a. The fill-in material could have a low refractive index, as discussed above in relation to the pyramidal pillars. The rods 192 lie on a base layer 194 such as the ones described above for the pillar ensembles with pyramidal outline. The backside of the base layer can have the extractor regions and Ohmic contacts formed on them (not shown). Also, a metal reflector covers the back side of the base layer so that the incident light can make several passes through the rod-like absorbers (not shown).

Figure 15B:
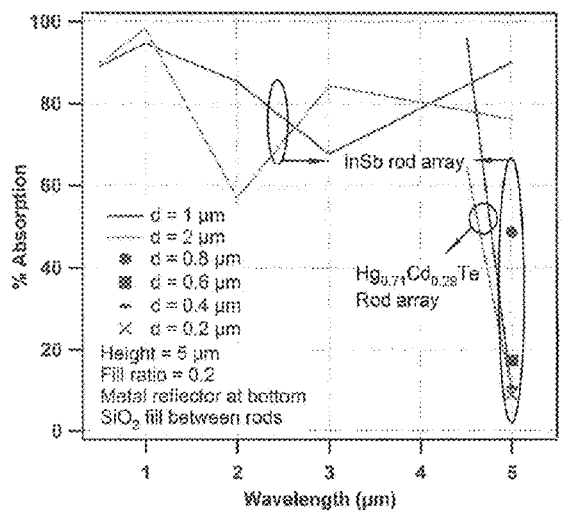

FIG. 15b shows results of simulations done using HFSS, an electromagnetic field simulation tool from Ansoft Corporation. The simulations considered various diameters of rods, ranging from 0.2 micrometers to 2.0 micrometers. The center-to-center spacing between rods is twice the diameter. Thus, the rods occupy approximately 20% of the total volume of the equivalent slab containing those absorber pillars (i.e., the volume fill ratio is 0.2). For incident light of 5 micrometer wavelength, the amount of light that is absorbed by the structure 190 increases as the diameter of the rod 192 is increased, up to a diameter of 1 micrometer. FIG. 15b also shows simulation results for rods of 1 or 2 micrometer diameter. The absorbance for incident light of wavelengths between 0.5 and 5.0 micrometers is calculated, assuming rod formed from InSb or HgCdTe absorber materials. The absorbance is quite high, generally >70%, for these larger diameter rods. Note that the bandgap of the HgCdTe material considered in these simulations allows that absorber to absorb light of 4.5 micrometer wavelength but be nearly transparent to 5.0 micrometer light. Thus, the calculations for this HgCdTe illustrate the effects of absorber bandgap.

Figure 16:
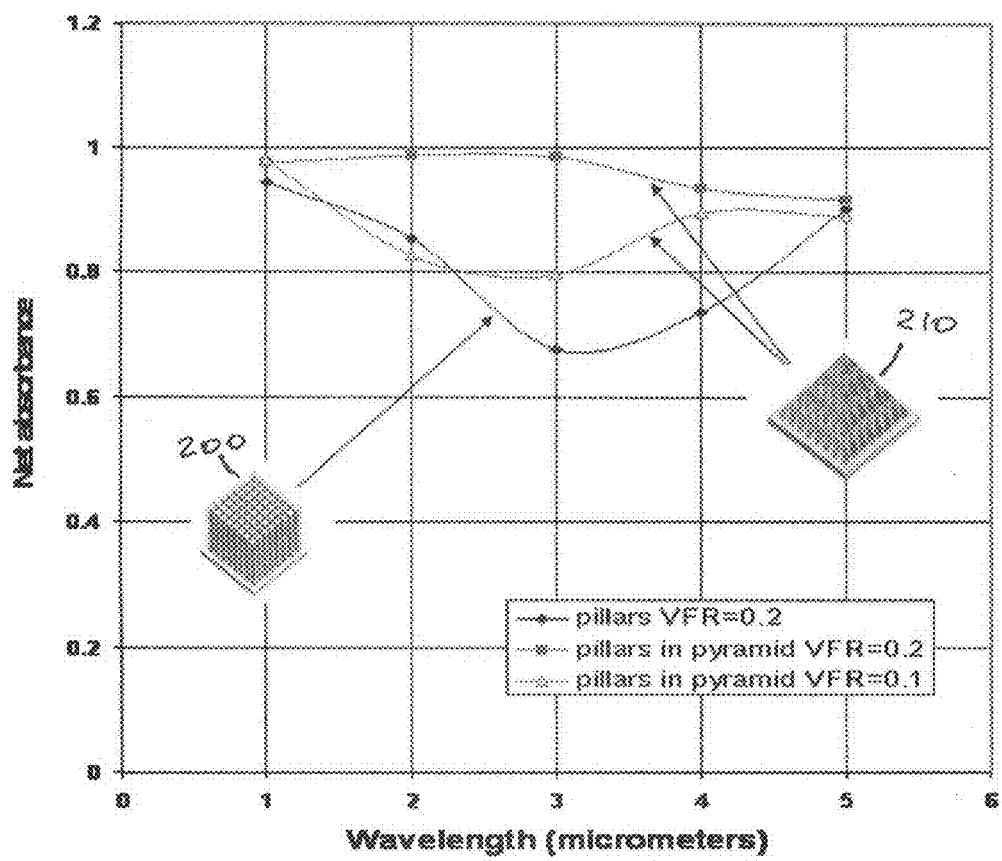
FIG. 16 depicts simulation results illustrating effect of absorber volume fill ration on detector absorbance.

FIG. 16 compares the absorbance of a detector with pillars having the same height 200 and the absorbance of detectors with pillars whose heights follow a pyramidal outline 210. The pyramidal outline reduces the volume fill ratio to approximately 33%. Thus, in order to achieve a comparable volume fill ratio with pyramidal pillars 210, the spacing between those pillars can be reduced, compared to the spacing used when the pillars have uniform height 200. The HFSS results in FIG. 16 show that for a given volume fill ratio of 0.2, a pillar ensemble with a pyramidal outline 210 has greater net absorbance, and over a larger range of incident wavelengths, than an ensemble of uniform height pillars 200. In fact, the volume fill ratio of the pyramidal pillars 210 can be reduced even further to 0.1 and still achieve higher absorption (and thus high detection efficiency) than the uniform-height pillars 200.

Figure 17:
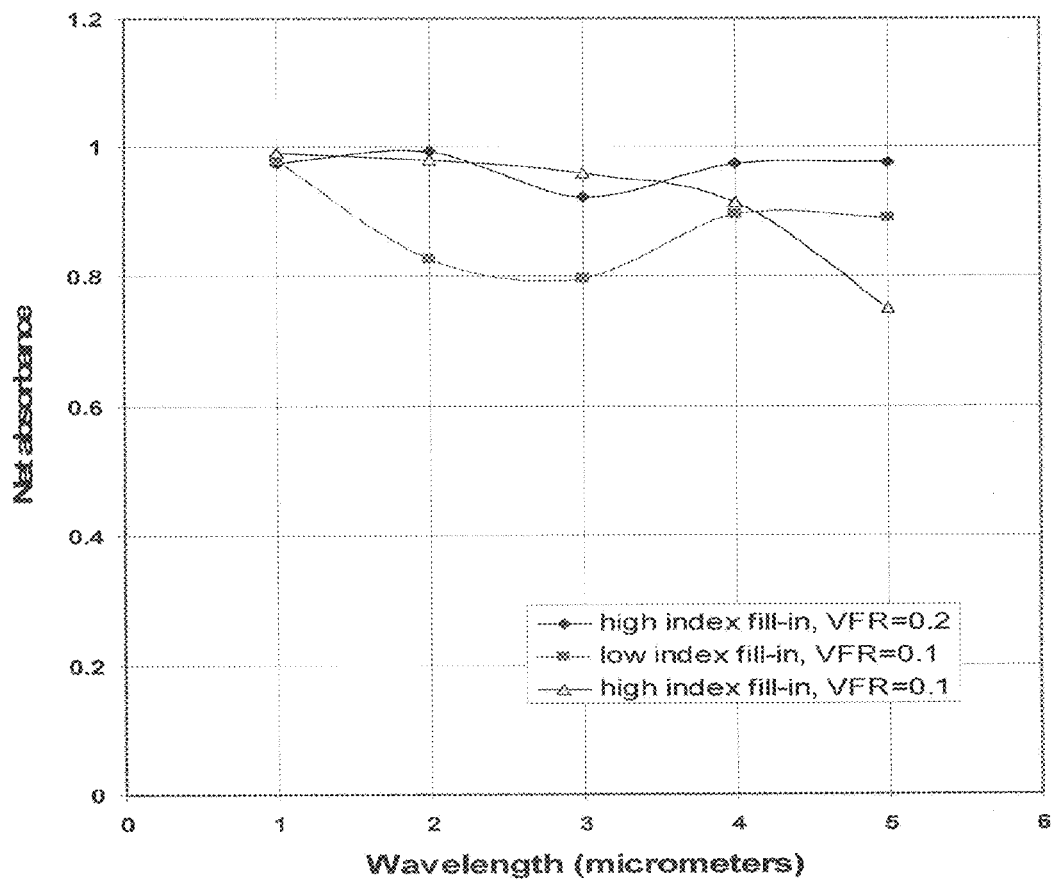
FIG. 17 depicts simulation results illustrating effect of fill-in refractive index on detector absorbance.

FIG. 17 depicts HFSS simulation results for pyramidal pillars that have a high-index fill-in material. As can be seen, when the volume fill ratio is 0.2, the absorbance of the structure can be greater than 90% over a large range of incident wavelengths. The absorbance for some wavelengths in that range degrades, to 80% or lower, when the volume fill ratio is further reduces to 0.1. These calculations, and the calculations of FIG. 16, assume an InSb absorber material and do not include an absorbing base layer. Instead, a metal reflector is placed directly at the base of the pyramidal pillars 210.

As shown by the simulation results presented in FIGS. 15b-17, a detector with an ensemble of absorber pillars can achieve high absorption of the incident light having a large range of wavelengths (e.g., between 1 and 5 micrometers). A conventional detector with a slab of absorber material of the same overall thickness has absorption between 58% and 68% over this same range of wavelengths. The pillared absorbers achieve more efficient absorption and yet have much smaller volume of absorber material. Thus, a detector with the pillared absorbers should have much lower dark current than a conventional detector. The detectivity of an infrared detector is proportional to the square root of the absorption efficiency and is inversely proportional to its dark current. Thus, the disclosed detectors and detector arrays with absorber pillars can achieve detectivity that is several times greater than obtainable with conventional detectors having planar absorber regions. Also, that high detectivity is achieved over a much larger span of wavelengths for the incident light.

FIGS. 18a-18l depict an exemplary fabrication process for fabricating the detector array and attaching that detector array to the read-out integrated circuit as described above. The following fabrication process is suitable for all of the embodiments disclosed herein of the detector array. For clarity, FIGS. 18a-18l depict pyramids as being solid instead of having pillars. However, this is done for clarity purposes only and this process applies to pillars of different heights that form a pyramidal outlines.

Figure 18A:
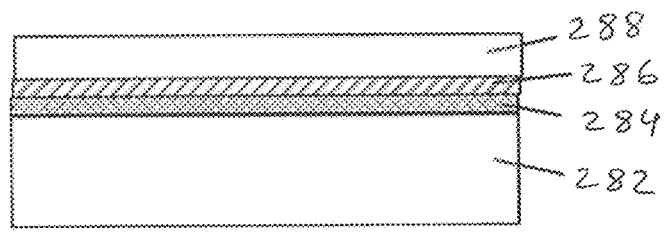

Referring to FIG. 18a, using epitaxial growth technique such as molecular beam epitaxy or metal-organic chemical vapor deposition, an optional stop etch layer 284, an extractor layer 286 and then the absorber layer 288 are formed on a substrate wafer 282. In one exemplary embodiment, for detection of optical wavelengths of 4-5 µm and shorter, the substrate wafer 282 may be composed of GaSb material, the optional stop etch layer 284 may be composed of AlGaSb material, the p-doped extractor layer 286 may be composed of InAsSb material, and an n-doped absorber layer 288 may be composed of InAsSb material. In another exemplary embodiment, the substrate wafer 282 may be composed of GaSb material, the optional stop etch layer 284 may be composed of AlGaSb material, the n-doped extractor layer 286 may be composed of InAsSb material, and the p-doped absorber layer 288 may be composed of InAsSb material. Lattice matched $InAs_{0.9}Sb_{0.1}$, for example, provides absorption of wavelengths of 4.7 µm and shorter when operated at 300K temperature and absorption of wavelengths of 4.3 µm and shorter when operated at 200K temperature.

For detection of wavelengths as long as 5.0 µm at 200K temperature, material such as $InAs_{0.8}Sb_{0.2}$, having substantial lattice mismatch (approximately +0.7%), could be used. Another alternative to InAsSb is to use a Type II superlattice consisting of InAs/GaSb material for the absorber 288. Another example of a suitable substrate 282, for detection of >5.0 µm wavelength light, is InSb material. The optional stop etch layer 284 could be a thin layer of InAlSb material. The extractor 286 and absorber 288 could be composed of doped InSb or InAlSb material.

Other examples of extractor 286 materials include extractors 286 composed of multiple layers of semiconductor material. In one exemplary embodiment, the extractor 286 for an n-type InAsSb absorber 288 could be composed of layers of n-type GaAlAsSb and p-type GaSb materials. Such a structure facilitates the flow of the photo-generated electrons away from the extractors 286 and to the ohmic contact of the absorber 288. Such a structure also is effective in reducing the dark current that arises from the depletion layer between the absorber 288 and extractor 286, as discussed in an article by P. Klipstein ("XBn barrier photodetector for high sensitivity and high operating temperature infrared sensors," Proceedings of SPIE, vol. 6940, paper 69402U-1), which is incorporated herein by reference. In another exemplary embodiment, the extractor 286 for n-type InAsSb absorber 288 could be composed of layers of n-type GaAlAsSb, p-type GaSb and then n-type InAs materials. The use of the additional n-type InAs layer, which forms a Type II energy-gap alignment with the GaSb, permits the ohmic contact for both the extractor 286 and the absorber 288 to be made to n-type, narrow bandgap materials.

Figure 18B:
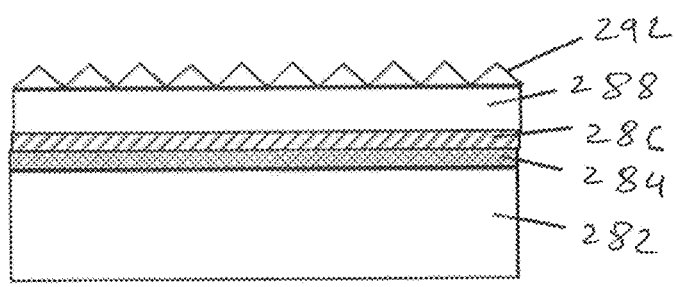
Figure 18C:
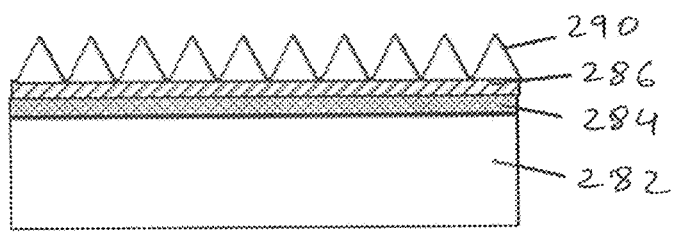

Referring to FIGS. 18*b* and 18*c*, pyramidal shapes 290 are formed in the absorber layer 288. An etching process may be used to form pyramidal shapes 290. In one exemplary embodiment, the pyramid shapes 290 are etched by depositing and forming an etch mask 292 that has a pyramid shape. The pyramid outline of the masking material 292 may then be transferred into the absorber 288 by dry etching techniques such as, for example, reactive ion etching or ion beam milling. The height of the masking layer 292 may depend on the dry-etch selectivity between the masking material 292 and the material of the absorber 88. Suitable etch masks 292 may include photoresist, polymers such as benzo-cyclo-butene, and silicon dioxide. A pyramid shape may be formed in photoresist by gray scale lithography. A pyramid shape may be formed in non-photo-definable polymers by means of imprint lithography using a mold that has an inverted pyramid shape. A pyramid shape may be formed in silicon dioxide by using an additional thin mask layer having a square shape and then etching the silicon dioxide with an isotropic wet etchant.

Figure 18D:
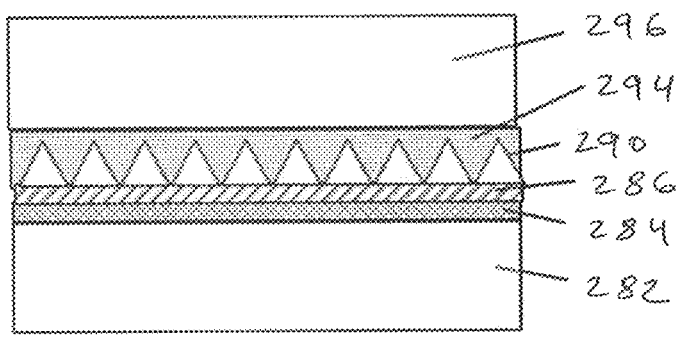

Referring to FIG. 18*d*, a material 294 is deposited in the spaces between the pyramids 290. In one exemplary embodiment, the material 294 may be composed of spin on glasses and various polymers. The material 294 may then be planarized. An optional adhesion layer (not shown) can be deposited on top of the planarized material 294. Then, a carrier substrate 296 is attached or bonded to the surface of the planarized material 294 or the adhesion layer (not shown). This process is used for wafer transfer.

Figure 18E:
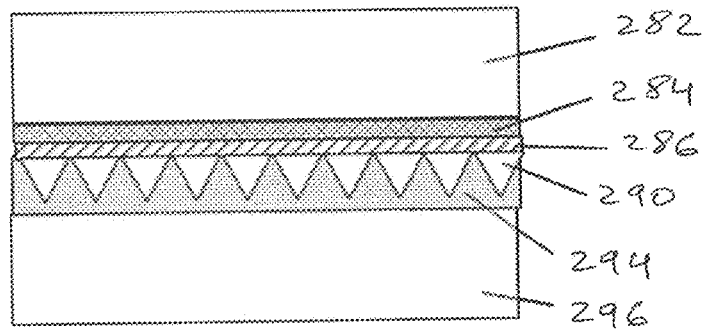
Figure 18F:
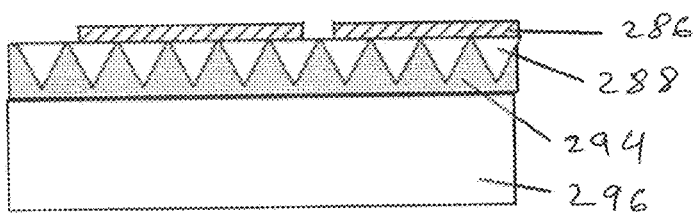

Referring to FIG. 18*e*, the structure shown in FIG. 18*d* is turned upside-down. Referring to FIG. 18*f*, the substrate 282 is removed or etched away as know in the art. The stop etch layer 284 facilitates this substrate 282's removal. The stop etch layer 284 is then also removed by known etching techniques, leaving the extractor layer 286 exposed. The extractor 286 may then be patterned by known photolithography and wet or dry etching methods. In fact, the exposed back side of the absorber layer 288 also can be etched. One exemplary embodiment that makes use of etching the absorber 288 from its back side is discussed below. The back surface of the back-side etched extractor 286 and absorber 288 could have various shapes, including pyramid shapes, as discussed in detail below.

Figure 18G:
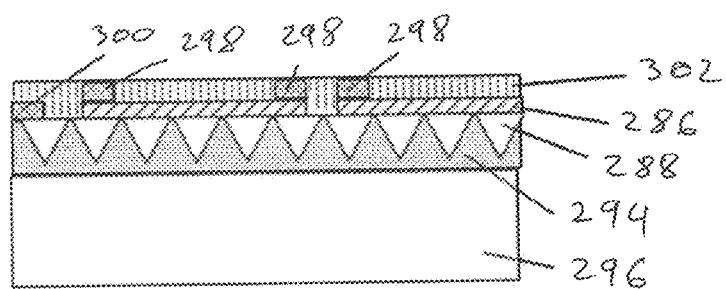

Referring to FIG. 18*g*, regions of ohmic-contact metals 298 and 200 are then deposited and patterned using exemplary techniques such as evaporation and lift-off or sputtering and etching. Both the ohmic-contact metals 298 for the extractor 286 and the ohmic-contact metal 300 for the absorber 288 may be deposited and patterned at the same time. Following the formation of the ohmic-contact metals 298 and 300, or in some cases before their formation, a film of dielectric passivation material 302 composed of, for example, silicon dioxide, polyimide or benzo-cyclo-butene material is deposited on top of the structure. This passivation material 302 may serve to reduce the amount of surface recombination that occurs in the semiconductor material, and especially at the outer edges of PN junctions.

Figure 18H:
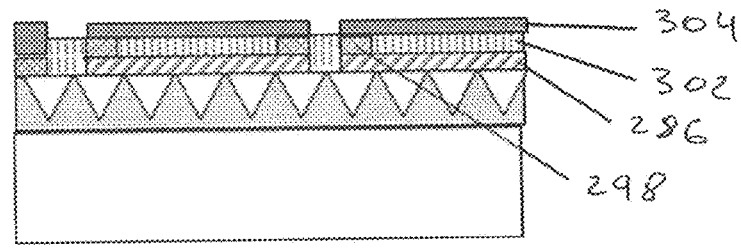

Referring to FIG. 18*h*, vias may be patterned and etched through the dielectric passivation material 302 to expose certain regions of or for the ohmic-contact metals 298 and 300. Metal bonding pads 304 may then be deposited and patterned. These metal bonding pads 304 can then be used for solder bump 306 bonding of the detector array to the read-out integrated circuit 310, as illustrated in FIGS. 18*i*-18*l*.

Referring to FIGS. 18*i*-18*j*, once the detector array, held on the carrier substrate 296, is bonded to the read-out integrated circuit 310, the carrier substrate 296 can then be removed. In one exemplary embodiment, a protective layer of material (not shown) such as photoresist may be used to cover and protect the read-out integrated circuit 310, the solder bumps 306 and the bond pads 304 and 308 from the etchant used to remove the carrier substrate 296. Referring to FIG. 18*k*, after the carrier substrate 296 is removed, the adhesion material (not shown) over the pyramids 290 may also be removed, and the planarization/fill material 294 may be optionally removed as well. Referring to FIG. 18*l*, in one exemplary embodiment, ohmic contacts 312 may be formed on the tips of the pyramids 290 and additional metal interconnects can be deposited on patterned onto the now exposed top side of the detector array. These top-side metal interconnects are further discussed below.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. Other embodiments are within the scope of the claims. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. An absorber of incident light comprising:
   a base layer; and
   a plurality of pillars disposed above the base layer and composed of material configured to absorb an incident light and generate minority electrical carriers and majority electrical carrier,
   wherein the plurality of pillars collectively form an outline of a pyramid.

2. The absorber of incident light of claim 1, further comprising fill-in material disposed between the pillars.

3. The absorber of incident light of claim 2, wherein the fill-in material comprises material with high refractive index.

4. The absorber of incident light of claim 2, wherein the minority electrical carriers and the majority electrical carriers flow substantially vertically through the pillars towards the base layer.

5. The absorber of incident light of claim 2, wherein the fill-in material comprises semiconductor material that is transparent to the incident light.

6. The absorber of incident light of claim 2, wherein the minority electrical carriers flow substantially vertically through the pillars towards the base layer and the majority electrical carrier flow laterally through the pillars and the fill-in material towards the base layer.

7. The absorber of incident light of claim 1, wherein the pillars and the base layer are composed of the same material.

8. A detector comprising:
   an extractor layer;
   an absorber layer disposed above the extractor layer;
   a first electrical contact; and
   a second electrical contact,
   wherein the absorber layer is configured to absorb photons of incident light and generate minority electrical carriers and majority electrical carriers;
   wherein the absorber layer comprises a first plurality of pillars that collectively form an outline of a first pyramid;
   wherein the extractor layer is electrically connected with the absorber layer and with the first electrical contact for extracting the minority electrical carriers, and the absorber layer is electrically connected with the extractor layer and with the second electrical contact to extract the majority electrical carriers.

9. The detector of claim 8, further comprising a base layer disposed between the extractor layer and the absorber layer, wherein the base layer is composed of the same material as the absorber layer.

10. The detector of claim 8, further comprising a read-out integrated circuit configured to process signals from the first electrical contact and the second electrical contact.

11. The detector of claim 8, further comprising a metal pad adjacent to the extractor layer, the metal pad configured to reflect incident light into the absorber layer.

12. The detector of claim 11, further comprising a dielectric buffer separating the absorber layer and the metal pad.

13. The detector of claim 8, wherein the absorber layer comprises a second plurality of pillars that collectively form an outline of a second pyramid, wherein each pyramidal outline is composed of pillars with predetermined height.

14. The detector of claim 13, further comprising a plurality of extractor layers, wherein each pyramidal outline of pillars is disposed directly above one of the extractor layers in the plurality of the extractor layers.

15. The detector of claim 14, further comprising a plurality of electrically interconnected contacts, wherein each contact in the plurality of electrically interconnected contacts is electrically connected with one of the extractor layers in the plurality of the extractor layers.

16. The detector of claim 8, wherein the absorber layer comprises lightly doped n-type material or p-type material.

17. The detector of claim 8, wherein the extractor layer comprises p-type material and the absorber layer comprises n-type material, or the extractor layer comprises n-type material and the absorber layer comprises p-type material.

18. The absorber of incident light of claim 8, further comprising fill-in material disposed between the pillars.

19. The detector of claim 18, wherein the electronic energy-band structures of the fill-in material and the absorber layer comprise a staggered Type-II alignment of energy bands.

20. The detector of claim 18, wherein the absorber layer comprises p-type material and the fill-in material comprises p-type material, or the absorber layer comprises n-type material and the fill-in material comprises n-type material.

21. The detector of claim 8, further comprising material disposed on the sidewalls of the pillars.

22. The detector of claim 8, further comprising material disposed on the top of each pillar.

23. A method of detecting incident light, the method comprising:
    providing an absorber layer comprising a plurality of pillars that collectively form an outline of a pyramid, wherein the absorber layer is configured to reduce reflection of an incident light and generate minority electrical carriers and majority electrical carriers; and
    providing an extractor layer for extracting the minority electrical carriers.

24. The absorber of incident light of claim 2, wherein the refractive index of the fill-in material is substantially equal to the refractive index of the pillars.

25. The absorber of incident light of claim 2, wherein the plurality of pillars and the fill-in material form the pyramid.

26. The detector of claim 8, wherein the height of the pillars within the first plurality of pillars varies to form the outline of the first pyramid.

27. The detector of claim 18, wherein the plurality of pillars and the fill-in material form the first pyramid.

28. The method of claim 23, wherein the height of the pillars within the plurality of pillars varies to form the outline of the pyramid.

29. An absorber of incident light comprising:
    a base layer; and
    one or more pyramid-shaped regions disposed above the base layer, wherein the one or more pyramid-shaped regions define one or more cavities above the base layer, wherein the one or more pyramid-shaped regions comprise an absorbing material and non-absorbing fill-in material, wherein the absorbing material is configured to absorb an incident light and generate minority electrical carriers and majority electrical carriers, wherein the absorbing material comprises one or more pillars, and wherein the non-absorbing fill-in material is disposed alongside and between adjacent ones of the one or more pillars.

30. The absorber of incident light of claim 29, wherein refractive index of the fill-in material is substantially equal to refractive index of the one or more pillars.

31. The absorber of incident light of claim 1, wherein the height of the pillars within the plurality of pillars varies to form the outline of the pyramid.

* * * * *